United States Patent [19]
Grosshans

[11] Patent Number: 5,898,620
[45] Date of Patent: Apr. 27, 1999

[54] METHOD FOR DETECTING ERRONEOUSLY PROGRAMMED MEMORY CELLS IN A MEMORY

[75] Inventor: Peter Grosshans, Hochdorf/Enz, Germany

[73] Assignee: Robert Bosch GmbH, Stuttgart, Germany

[21] Appl. No.: 09/120,859

[22] Filed: Jul. 22, 1998

[30] Foreign Application Priority Data

Jul. 24, 1997 [DE] Germany .......................... 197 31 954

[51] Int. Cl.$^6$ .............................. G11C 16/04; G11C 7/00
[52] U.S. Cl. ................... 365/185.29; 365/185.3; 365/218
[58] Field of Search ...................... 365/185.09, 185.11, 365/185.12, 185.29, 185.3, 185.33, 218

[56] References Cited

U.S. PATENT DOCUMENTS 5,745,410  4/1998  Yiu et al. ............................ 365/185.29
5,822,245  10/1998 Gupta et al. ........................ 365/185.33

*Primary Examiner*—Trong Phan
*Attorney, Agent, or Firm*—Kenyon & Kenyon

[57] ABSTRACT

A method for detecting erroneously programmed memory cells of a memory, in particular for detecting overprogrammed memory cells of a flash semiconductor memory. The memory includes a plurality of memory cells, which can be subdivided into a number of blocks that can be erased as a unit, which in turn can be divided into a group of subblocks that can be programmed as a unit. The erroneous programming of a memory cell of a subblock causes each subblock of a number of subblocks that can be represented by an erroneously programmed subgroup to have a similarly erroneously programmed memory cell.

14 Claims, 1 Drawing Sheet

METHOD FOR DETECTING ERRONEOUSLY PROGRAMMED MEMORY CELLS IN A MEMORY

FIELD OF THE INVENTION

The present invention relates to a method for detecting erroneously programmed memory cells in a memory by detecting overprogrammed memory cells in, for example, a flash semiconductor memory that includes a plurality of memory cells. The memory cells can be divided into a number of blocks that can be cleared as a unit. The blocks are subdivided into a group of subblocks (pages) that can be programmed as a unit. Erroneous programming of a memory cell in a subblock causes each subblock of a number of subblocks, which can be represented by an erroneously programmed subgroup of the group, to have an equally erroneously programmed memory cell.

BACKGROUND INFORMATION

As used herein, the term "erroneously programmed" must be understood in the general sense, namely as the erroneous programming of a memory cell of a subblock, which causes the corresponding memory cells in a subgroup of subblocks to be erroneously programmed.

Semiconductor memories can in general be divided in table memories and function memories. The present invention concerns table memories in particular, which have a plurality of memory cells, each memory cell being assigned a certain address. Table memories may be of the read-write (RAM) or read-only (ROM) type.

EPROMs and EEPROMs are special types of ROMs, which can not only be programmed by the user, but can also be erased; EPROM memory cell blocks can be erased using ultraviolet light and selected EEPROM memory cells can be erased (e.g., by byte) with an electric voltage pulse.

Flash memories (also known as flash EEPROMs or flash RAMs) represent something in between EPROMs and EEPROMs. They can be electrically erased, not by byte-like EEPROMs, but by block-like EPROMs. However, more recent developments have allowed these erasable flash EEPROM blocks to become smaller and smaller.

Flash memories can be manufactured less expensively than EEPROMs and have a higher data density. Therefore they are particularly sought after in applications where there is little space available, e.g., in laptops, notebooks or high-performance microcontroller chips.

To make better use of the chip surface, the flash memory array is usually divided into blocks and block subgroups, known as pages.

The underlying problem to be solved by the present invention is, in general, that when parts of the flash memory are erased and programmed, errors may occur, which may result in data losses or erroneous programming in other areas of the flash memory (collective error propagation). In the case of some errors, such as overprogramming, it is difficult to detect and correct the error.

Overprogramming is elucidated with reference to a concrete example of a microcontroller.

A non-volatile memory chip in the form of a flash memory array is implemented in this microcontroller. This flash memory array is divided into 32-kB erasable blocks, and the blocks are in turn divided into 8-word-long pages (1 word= 32 bits).

Thus, stored data can only be erased in the 32-kB blocks, while programming can be done in the 8-word pages.

If a memory cell (1 bit) of a page goes from a non-programmed (erased) to a programmed state, the characteristics of the memory cells, or more precisely of the respective field-effect transistors, cause this cell to reach a state that is referred to as overprogrammed. This overprogrammed state is distinguished by the fact that the cell constantly sheds its stored information outward even without additional activation of the memory cell when the respective page is read.

Due to the special structure of the flash memory array, overprogrammed memory cells also interfere with reading of the other pages. This causes data stored on the other pages to be corrupted and possibly erroneously output.

An overprogrammed memory cell can be returned to the erased state by erasing the entire 32-kB block containing the overprogrammed memory cell.

Which pages are affected by an overprogrammed memory cell depends on the structure of the memory array. Often not all the other pages are affected, but only the memory cells of the pages located in the same column of the memory array. The error then occurs at a periodic distance from the page with the overprogrammed cell in the flash memory array.

Without being familiar with the history of the flash memory array, it is not possible to detect such overprogrammed cells.

SUMMARY OF THE INVENTION

An object of the present invention is to provide a method for detecting erroneously programmed memory cells of a semiconductor memory in a simple and reliable way by taking advantage of the nature of error propagation. Furthermore, the method according to the present invention allows repair at an early stage if it is determined that the programmed memory cells of a service subblock or a programmed reference subblock have at least one erroneously programmed memory cell. Namely, the block containing the erroneously programmed memory cell can be erased without first unnecessarily programming other subblocks or pages.

In the present invention, a reference subblock or a reference page is determined for one or more service subblocks or service pages in each first erroneously programmed subgroup found. Whether the programmed memory cells of each service subblock contain one or more erroneously programmed memory cells can be determined by preprogramming the memory cells of the reference subblock prior to programming the memory cells of the respective service subblock, and reading the preprogrammed memory cells of the reference subblock after programming. In other words, there is erroneous programming if the memory cell in the reference subblock goes from erased (logical "0") to programmed (logical "1") at the same time as the memory cell of the service subblock.

According to the present invention, the programming steps in programming the memory cells of a first service subblock, reading of the preprogrammed memory cells of the reference subblock, and the determination of whether the programmed memory cells of the first service subblock have one or more erroneously programmed memory cells are repeated based on the read result for all the other service subblocks of the first erroneously programmed subgroup found.

According to another embodiment of the present invention, if it is determined that the programmed memory cells of any service subblock have at least one erroneously programmed memory cell, the block is erased and reprogrammed.

According to another embodiment of the present invention, it is determined whether unprogrammed memory cells corresponding to the respective memory cells of the reference subblock exist in the programmed service subblocks; if so, an unprogrammed memory cell is determined for each corresponding memory cell of the reference subblock. This procedure allows the reference page to be programmed with service data in a controlled manner.

According to another embodiment of the present invention, the memory cells of the reference subblock are programmed; the unprogrammed memory cells found are read; and, based on the reading result, it is determined whether the programmed memory cells of the reference subblock contain one or more erroneously programmed memory cells.

According to another embodiment of the present invention, if it determined that the programmed memory cells of the reference subblock contain one or more erroneously programmed memory cells, the block is erased and reprogrammed.

According to another embodiment of the present invention, all the other erroneously programmed subgroups of the block and the corresponding reference subblocks and service subblocks are determined until at least each subblock of an erroneously programmed subgroup is detected; the subblocks of the other erroneously programmed subgroups are programmed accordingly. This procedure ensures that erroneously programmed memory cells are always detected based on the knowledge of the memory structure.

According to another embodiment of the present invention, a matrix is associated with the group, and the rows and columns are associated with the matrix so that a subgroup of a subblock is a column of the matrix. This procedure facilitates data processing when erroneous programming is detected.

According to another embodiment of the present invention, all the reference subblocks required for the last row of the matrix are determined in the last row.

According to another embodiment of the present invention, the content of a service subblock is saved in an auxiliary memory, or another unused subblock of the same block, or another block prior to programming. This allows pages to be programmed stepwise.

According to another preferred refinement, at least one programming parameter, in particular the number or amplitude of the programming pulse, is changed if it is determined that the programmed memory cells of a service subblock or a programmed reference block contain at least one erroneously programmed memory cell. This procedure allows the programming parameters to be optimized.

According to another embodiment of the present invention, all the memory cells of the respective reference subblock are preprogrammed in their erased state.

BRIEF DESCRIPTION OF THE DRAWING

The drawing shows a flash memory to be used in accordance with the method of the present invention, the flash memory including four blocks and n×k pages, where n and k are integers.

DETAILED DESCRIPTION

Figure 1:
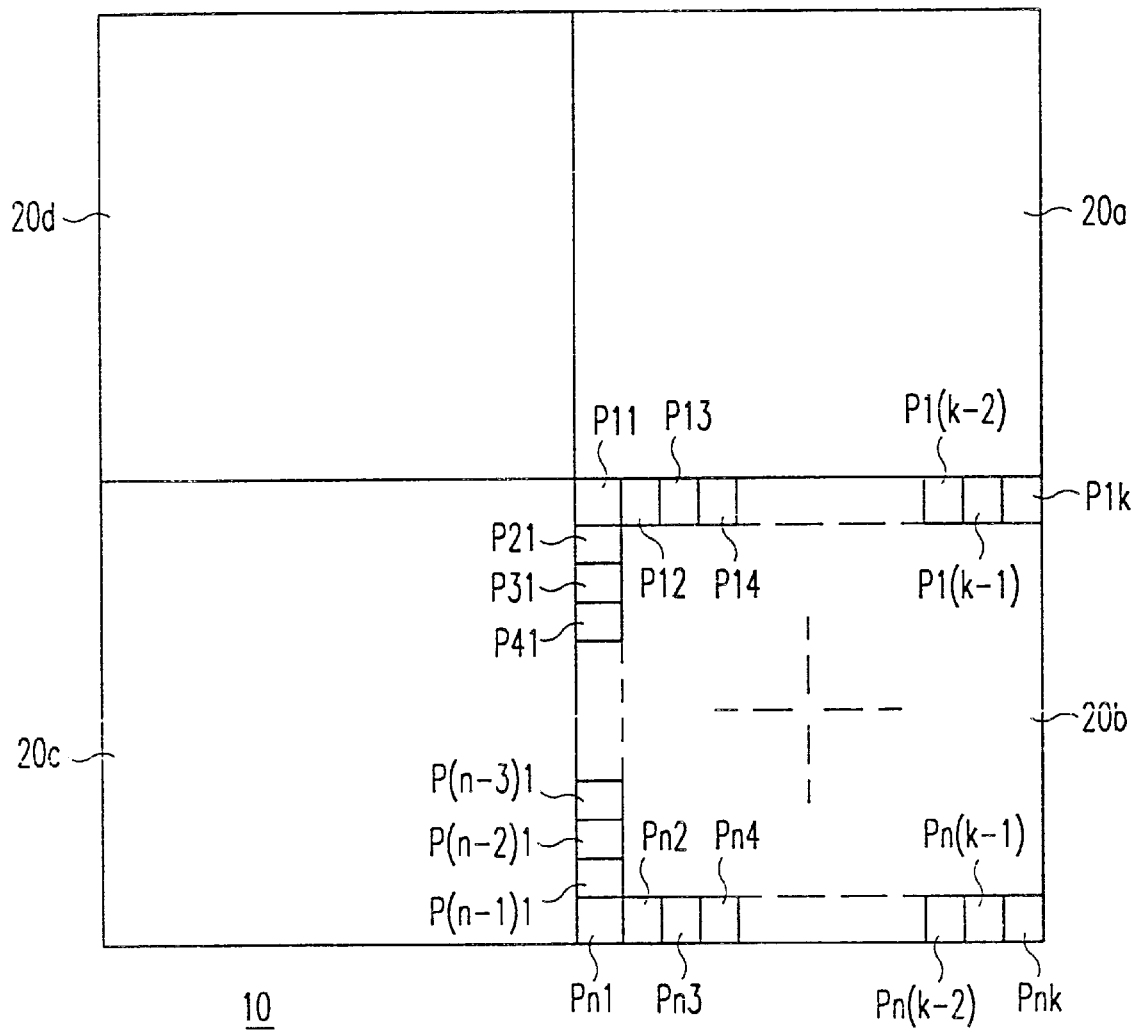

The drawing shows flash memory 10, first to fourth block 20*a* through 20*d*, and (n×k) pages (subblocks) P11 through Pnk, where n and k are integers. The integer n may vary, for example, from 1 to 128, and k may vary from 1 to 8. The individual pages P11 through Pnk contain eight 4-byte words each, i.e., 32 bytes or 256 bits. In other words, pages P11 through Pnk form a matrix with 128 rows and 8 columns, i.e., each block 20*a* through 20*d* of flash memory 10 contains a total of 1024 pages.

Blocks 20*a* through 20*d* form the smallest erasable unit in flash memory 10, and pages P11 through Pnk form the smallest programmable unit.

In this embodiment of flash memory 10, an overprogrammed memory cell in page P11 will result in each page P11, P21, P31, P41, . . . , $P(n-3)1$, $P(n-2)1$, $P(n-1)1$, Pn1 having a similar overprogrammed memory cell. This means that in all these pages P11-Pn1, or in the first column of the matrix, the respective bit appears as programmed, although it has only been actually programmed in page P11. This error can be eliminated by erasing the entire block 20*b*.

However, the method according to the present invention must be used first, with which the occurrence of this error can be detected rapidly and reliably.

The method according to the present invention makes use of the fact that the overprogrammed cells can be represented by an erroneously programmed subgroup of pages, namely by the respective columns or column vectors of the matrix, which is predefined in advance through the special structure of flash memory 10.

Thus, in order to carry out the method according to the present invention, a reference page is defined for each column, i.e., each erroneously programmed subgroup—in this embodiment the last page Pn1, Pn2, Pn3, Pn4, . . . , $Pn(k-2)$, $Pn(k-1)$, Pnk. The other pages of each column of the matrix are service pages, i.e., they are used for storing actual data.

Then the memory cells of the reference pages Pn1, Pn2, Pn3, Pn4, . . . , $Pn(k-2)$, $Pn(k-1)$, Pnk and of the service pages are all erased in a block erase operation for block 20*b*.

Next, the memory cells of a first service page are programmed, for example, page P11. Then the preprogrammed (i.e., erased) memory cells of the reference page of the first column, i.e., page Pn1, are read.

Using the read result, it can be established whether the programmed memory cells of the first service page P11 have one or more overprogrammed memory cells. This is the case when one or more memory cells of reference page Pn1 are no longer erased (logical "0"), but programmed (logical "1"). In such a case, the entire block 20*b* is immediately erased and reprogrammed.

Then the previous steps are performed for all the other service pages, i.e., P11 through P1k, P21 through P2k, . . . and $P(n-1)1$ through $P(n-1)k$. The reference pages remain reserved in this embodiment, i.e., they are not used for storing actual data.

According to another embodiment of the present invention, the reference pages are also used for storing actual data; however, this requires additional measures.

It is assumed here that all service pages P11 through P1k, P21 through P2k, . . . and $P(n-1)1$ through $P(n-1)k$ are properly programmed.

Prior to programming the first reference page Pn1, it is determined whether unprogrammed memory cells corresponding to the respective memory cells of the first reference page Pn1 are present in programmed service pages P11 through $P(n-1)1$.

If so, one such unprogrammed memory cell is established for each corresponding memory cell of first reference page Pn1.

If no unprogrammed memory cell can be found in one of programmed pages P11 through P(n−1)1 for some memory cell of first reference page Pn1 to be programmed, this causes no problem, since even overprogramming would cause no error or data loss.

Then the memory cells of first reference page Pn1 is programmed and subsequently the unprogrammed memory cells found of the programmed service pages P11 through P(n−1)1 are read.

It is determined whether the programmed memory cells of the reference page has one or more erroneously programmed memory cells as was done in programming the service pages.

Also in this second embodiment block 20b is erased and reprogrammed if it is established that the programmed memory cells of first reference page Pn1 have at least one erroneously programmed memory cell.

The remaining reference pages Pn2 through Pnk are programmed in the same manner.

The above description of the first and second embodiments assumed that the data of block 20b to be programmed are fully available during page-by-page programming. If this is not the case, the current contents of a service page must be saved in an auxiliary memory, e.g., a RAM, or in another unused subblock of the same block 20b or of another block 20a, 20c, or 20d prior to programming.

Overprogramming of memory cells is caused by too many or too high programming pulses during programming. Therefore, according to another embodiment of the present invention, at least one such programming parameter, in particular the aforementioned number or amplitude of the programming pulses, is changed if it is determined that the programmed memory cells of a service page or of a programmed reference page have at least one overprogrammed memory cell.

Although the present invention was described above with reference to a preferred embodiment, it is not limited thereto, but can be modified in many ways.

In particular, the subblocks and the erroneously programmed subgroups do not need to be present in the form of a matrix or vectors, but other representations, such as tensor or analytic representations, are also possible.

Although in the first and second embodiments all the reference pages required for the matrix were established in the be estate row, this is not necessary as any pages can be established for this purpose; in general, it must be ensured that at least one reference cell is available for each service cell.

Finally, the present invention is not restricted to any particular type of memory or programming error, but can be used for any collectively propagating programming errors in any type of memory.

What is claimed is:

1. A method for detecting at least one erroneously programmed memory cell in a memory that includes a plurality of memory cells subdivided into a plurality of blocks, each block being erasable as a whole and being divided into a plurality of subblocks, each subblock being programmable as a whole, an erroneous programming of a memory cell of a subblock associated with one of the plurality of subblocks causing each other subblock within the plurality of subblocks containing the subblock with the erroneously programmed memory cell to include a corresponding erroneously programmed memory cell, the method comprising the steps of:

a) determining a first erroneously programmed subgroup associated with one of the plurality of blocks;

b) determining a reference subblock and at least one service subblock in the first erroneously programmed subgroup;

c) preprogramming each memory cell of the reference subblock;

d) programming each memory cell of a first service subblock of the at least one service subblock;

e) reading each preprogrammed memory cell of the reference subblock; and f) determining, as a function of a read result produced by step e), whether the programmed memory cells of the first service subblock include the at least one erroneously programmed memory cell.

2. The method according to claim 1, wherein the memory includes a flash semiconductor memory.

3. The method according to claim 2, wherein the at least one erroneously programmed memory cell includes at least one overprogrammed memory cell.

4. The method according to claim 1, further comprising the step of repeating steps d), e), and f) for each remaining service subblock of the first erroneously programmed subgroup.

5. The method according to claim 1, further comprising the step of erasing and reprogramming the block associated with the first erroneously programmed subgroup if any service subblock has at least one erroneously programmed memory cell.

6. The method according to claim 5, further comprising the steps of:

determining whether at least one unprogrammed memory cell is present in any programmed service subblock, the at least one unprogrammed memory cell corresponding to at least one memory cell of the reference subblock; and determining, if at least one unprogrammed memory cell is present in any programmed service subblock, an unprogrammed memory cell for each respective memory cell of the reference subblock.

7. The method according to claim 6, further comprising the steps of:

programming each memory cell of the reference subblock;

reading each determined unprogrammed memory cell; and establishing, based on the step of reading each determined unprogrammed memory cell, whether the reference subblock includes at least one erroneously programmed memory cell.

8. The method according to claim 7, further comprising the step of erasing and reprogramming the block associated with the first erroneously programmed subgroup if the reference subblock includes at least one erroneously programmed memory cell.

9. The method according to claim 8, further comprising the steps of:

determining each remaining erroneously programmed subgroup of the block associated with the first erroneously programmed subgroup;

determining each reference subblock and each service subblock associated with each determined remaining erroneously programmed subgroup; and programming each subblock of each determined remaining erroneously programmed subgroup.

10. The method according to claim 1, wherein the plurality of subblocks are arranged as a matrix having a plurality of rows and a plurality of columns, and wherein a subgroup of each subblock corresponds to a column of the matrix.

11. The method according to claim 10, wherein each reference subblock required for the matrix is determined in a last row of the matrix.

12. The method according to claim 1, wherein an active content of the at least one determined service subblock is saved in one of an auxiliary memory and an unused subblock of one of the same block as the at least one service subblock and another block, prior to the other block being programmed.

13. The method according to claim 7, further comprising the step of changing at least one of a number and an amplitude of a programming pulse serving as a programming parameter if each programmed memory cell of one of the at least one service subblock and the programmed reference subblock includes at least one erroneously programmed memory cell.

14. The method according to claim 1, wherein each memory cell of the reference subblock is preprogrammed in an erased state.

* * * * *

UNITED STATES PATENT AND TRADEMARK OFFICE
CERTIFICATE OF CORRECTION

PATENT No. :   5,898,620

DATED   :   April 27, 1999

INVENTOR(S):   Peter Grosshans

It is certified that error appears in the above-identified patent and that said Letters Patent is hereby corrected as shown below:

Column 5, line 47, "be estate" should be changed to --last matrix--.

Signed and Sealed this

Sixteenth Day of May, 2000

*Attest:*

Q. TODD DICKINSON

*Attesting Officer*   *Director of Patents and Trademarks*